United States Patent [19]
Lamson et al.

[11] Patent Number: 5,233,220
[45] Date of Patent: Aug. 3, 1993

[54] BALANCED CAPACITANCE LEAD FRAME FOR INTEGRATED CIRCUITS AND INTEGRATED CIRCUIT DEVICE WITH SEPARATE CONDUCTIVE LAYER

[75] Inventors: Michael A. Lamson, Westminster; Katherine G. Heinen, Dallas, both of Tex.

[73] Assignee: Texas Instruments Incorporated, Dallas, Tex.

[21] Appl. No.: 840,563

[22] Filed: Feb. 24, 1992

Related U.S. Application Data

[63] Continuation of Ser. No. 628,948, Dec. 14, 1990, abandoned, which is a continuation of Ser. No. 373,742, Jun. 30, 1989, abandoned.

[51] Int. Cl.$^5$ .......................................... H01L 23/48
[52] U.S. Cl. .................................. 257/666; 257/670; 257/676; 257/783; 257/784; 257/787
[58] Field of Search ......................... 357/70, 728, 74; 257/666, 670, 676, 783, 784, 787

[56] References Cited

U.S. PATENT DOCUMENTS

| | | | |
|---|---|---|---|
| 4,514,750 | 4/1985 | Adams | 357/70 |
| 4,551,747 | 11/1985 | Gilbert et al. | 357/74 |
| 4,594,641 | 6/1986 | Hernandez | 361/306 |
| 4,633,583 | 1/1987 | Kato | 357/70 |
| 4,680,613 | 7/1987 | Daniels et al. | 357/70 |
| 4,704,187 | 11/1987 | Fujita | 357/70 |
| 4,711,700 | 12/1987 | Cusack | 357/70 |
| 4,727,221 | 2/1988 | Saitou | 174/52 FP |
| 4,733,292 | 3/1988 | Jarvis | 357/70 |
| 4,743,956 | 5/1988 | Olla et al. | 357/70 |
| 4,754,317 | 6/1988 | Comstock et al. | 357/70 |
| 4,774,635 | 9/1988 | Greenberg et al. | 357/70 |
| 4,803,540 | 2/1989 | Moyer et al. | 357/70 |
| 4,803,544 | 2/1989 | Holzschuh et al. | 357/72 |
| 4,820,658 | 4/1989 | Gilder et al. | 357/70 |
| 4,862,245 | 8/1989 | Pashby et al. | 357/72 |
| 4,868,635 | 9/1989 | Frechette et al. | 357/70 |
| 4,872,260 | 10/1989 | Johnson et al. | 29/827 |
| 4,876,587 | 10/1989 | Hilton et al. | 357/70 |
| 4,953,002 | 8/1990 | Nelson et al. | 357/84 |
| 4,953,007 | 8/1990 | Erdos | 357/84 |
| 4,965,654 | 10/1990 | Karner et al. | 357/70 |

FOREIGN PATENT DOCUMENTS

0175145 10/1984 Japan .................................. 357/70

OTHER PUBLICATIONS

Volume Production of Unique Plastic Surface-Mount Modules for the IBM 80-ps 1-Mbit DRAM Chip by Area Wire Bond Techniques by W. C. Ward, IEE article. (1988).

Primary Examiner—Eugene R. LaRoche
Assistant Examiner—Viet Q. Nguyen
Attorney, Agent, or Firm—Lawrence J. Bassuk; Robby T. Holland; Richard Donaldson

[57] ABSTRACT

A lead frame (10) is connected over an integrated circuit (40) by adhesives (42) and (44). Each lead conductor (16) and (18) of the lead frame (10) has the identical geometric area in order to provide identical capacitances. A metal shield may be provided on adhesives (42) and (44) to provide noise shielding for the integrated circuit (40).

25 Claims, 3 Drawing Sheets

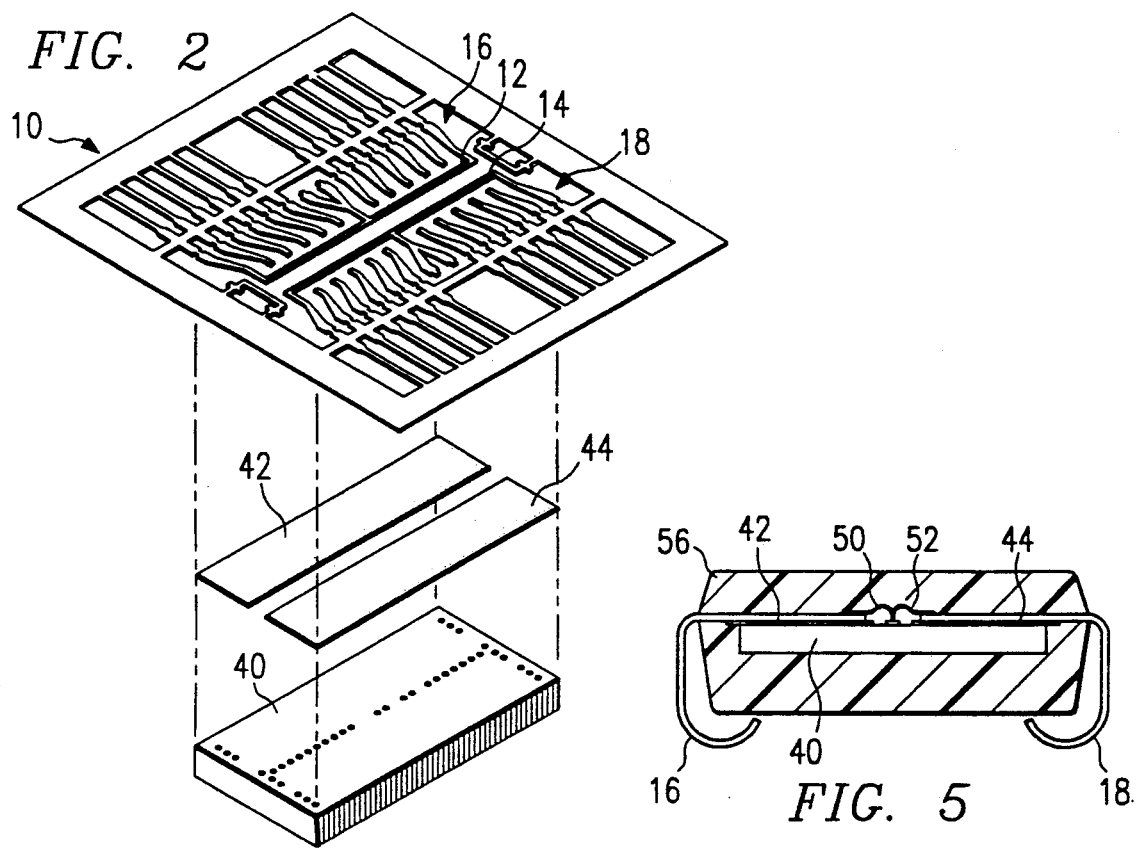
FIG. 2
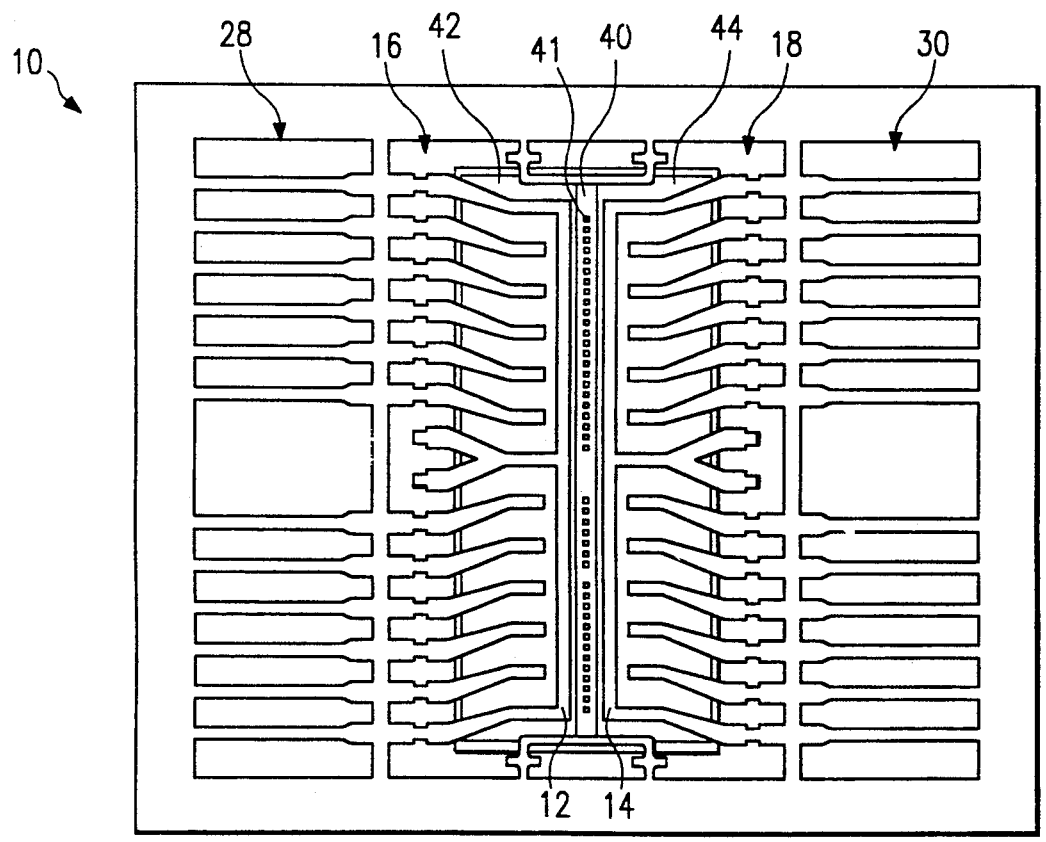
FIG. 5
FIG. 3

BALANCED CAPACITANCE LEAD FRAME FOR INTEGRATED CIRCUITS AND INTEGRATED CIRCUIT DEVICE WITH SEPARATE CONDUCTIVE LAYER

This application is a continuation of application Ser. No. 07/628,948, filed Dec. 14, 1990, abandoned, itself a continuation of patent application Ser. No. 07/373,742, filed on Jun. 30, 1989, abandoned.

TECHNICAL FIELD OF THE INVENTION

This invention relates to integrated circuits, and more particularly relates to a lead frame having balanced capacitance for use with integrated circuitry packaging.

BACKGROUND OF THE INVENTION

Various techniques have heretofore been used to package integrated circuits. For example, various configurations utilizing lead frames to connect integrated circuits have been developed, such as the flip chip design and the small outline J lead (SOJ) packaging techniques. In many of these prior techniques, the integrated circuit is mounted upon a pad provided by a lead frame, and wire bonds connect from the integrated circuit to conductive leads on the lead frame.

More recently, an integrated circuit packaging technique termed the lead on chip (LOC) technique has been developed. As described in the article entitled *Volume Production Of Unique Plastic Surface-Mount Modules For The IBM 80-ns 1-Mbit DRAM Chip By Area Wire Bond Techniques* by William C. Ward, published at the 38th ECC in 1988, this technique disposes a lead frame over the active area of an integrated circuit. Adhesive insulating tape connects the lead frame over the integrated circuit, and wire bonds connect the circuit directly to the power buses on the lead frame or jumper over the power buses to conductive leads to provide the correct signal routing. The ability to jump wires over various lead frame leads provides significant advantages by allowing alterable package I/O without chip redesign, since the wires can readily be routed over various buses or leads similar to conventional wire bonding as done on direct chip attached circuit cards.

While prior packaging techniques have worked well in practice for many designs, with the advent of more complex and smaller scale integrated circuits, it has become important to obtain equal loading capacitances for the input leads on the integrated circuit package. The provision of equal capacitances for various conductive leads is particularly significant for LOC applications, since the lead frame is separated from the active integrated circuit by a layer of dielectric. The requirement of equal capacitances for the conductive input leads has also become more important with the advent of large dynamic random access memory (DRAM) circuits such as the 16 meg DRAM. In such circuits, it is important that each address line has the same loading capacitance as the adjacent line in order to enhance the operational speed of the DRAM. Moreover, a need has arisen in the LOC package technique to provide additional noise shielding, which is particularly important in LOC devices because of the non-uniform metal closely adjacently disposed to the integrated circuit.

A need has thus arisen for a lead frame and integrated circuitry packaging technique which provides equal capacitances to all lead conductors associated with the integrated circuitry, while maintaining a high degree of noise shielding thereto.

SUMMARY OF THE INVENTION

In accordance with the present invention, disadvantages and problems associated with previously developed packaging techniques have been substantially reduced or eliminated by use of the present packaging invention. An integrated circuit is encapsulated in an insulating package, with conductive leads extending from portions of the integrated circuit to the external of the package. Each of the conductive leads has substantially the identical capacitance as the remaining conductive leads.

In accordance with another aspect of the invention, a lead frame is provided for integrated circuitry which includes a plurality of elongated conductive leads extending in a side-by-side relationship. The first ends of the leads are dimensioned to be connected to an integrated circuit and the second ends of the leads are dimensioned to provide electrical connection to external circuits. The geometrical area of each of the leads are substantially identical such that the capacitance of each of the leads is substantially identical.

In accordance with yet another aspect of the invention, a lead frame is constructed by providing openings in a sheet of conductive material which define two groups of conductive leads separated by at least one power bus. Each group of the conductive leads includes a plurality of elongated leads extending in a side-by-side relationship normally to the power bus. The geometrical area of each of the leads is substantially identical such that the capacitance of each of the leads is substantially identical.

In accordance with a more specific aspect of the invention, each of the conductive leads has a trapezoidal configuration, the geometric area of the trapezoidal configuration of each of the leads being substantially identical to the remaining leads.

In accordance with yet another aspect of the invention, at least one power bus is associated with the integrated circuitry. Portions of the power bus are oriented adjacent ones of the conductive leads and are provided with substantially identical geometric areas as the conductive leads in order to act as dummy leads to ensure equal capacitance of the remaining leads.

In accordance with another aspect of the invention, a conductive layer is disposed adjacent an insulating layer which separates the lead frame and the integrated circuitry in order to provide noise shielding to the integrated circuitry.

In accordance with yet another aspect of the invention, a method of forming an integrated circuit package includes disposing a conductive lead frame adjacent active portions of integrated circuit. The conductive lead frame is insulated from the integrated circuit. Portions of the integrated circuit are selectively interconnected with portions of the lead frame. The lead frame is configured and oriented such that individual conductive leads have substantially identical capacitances. A conductive layer may be provided to provide noise shielding to the integrated circuit.

BRIEF DESCRIPTION OF THE DRAWINGS

For a more complete understanding of the present invention and the advantages thereof, reference is now made to the following descriptions taken in conjunction with the accompanying drawings, in which:

FIG. 2 is a perspective, exploded view of the lead frame of the invention showing the adhesive tape and integrated circuit;

FIG. 3 is a top view of the lead frame of the invention showing the connection of the integrated chip thereunder;

FIG. 5 is a side view of the completed integrated circuit package;

FIG. 7 is a perspective view of a double-sided adhesive used to attach the lead frame to the top of the integrated circuit.

DETAILED DESCRIPTION OF THE INVENTION

Figure 1:
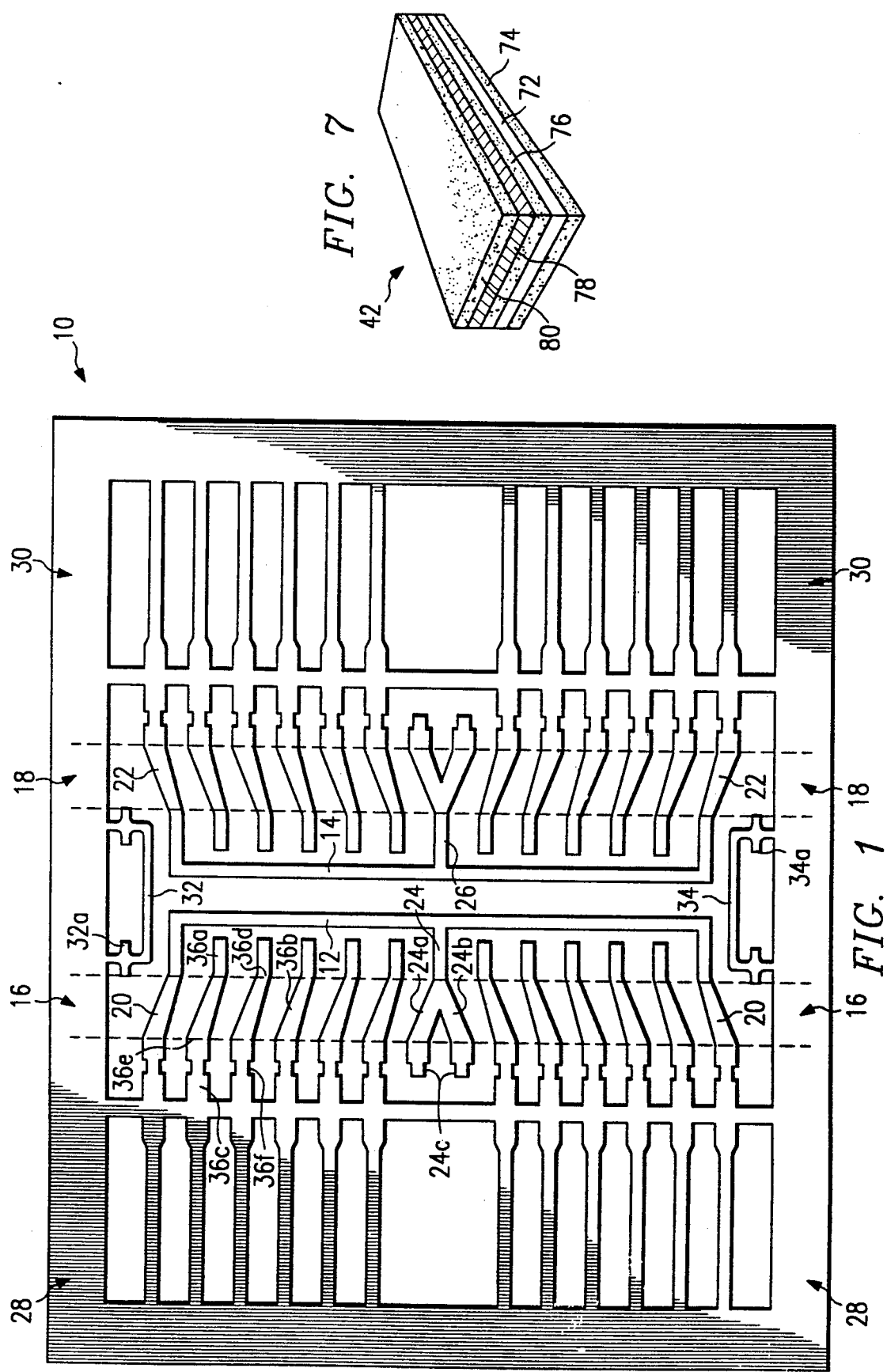
FIG. 1 is a top view of the lead frame of the present invention.

Referring to FIG. 1, a lead frame 10 of the present invention comprises a metal sheet which may be formed of, for example, full hard temper CDA alloy 151 which may be approximately 0.008 in thickness and which may be spot plated in gold, silver, or the like. The metal sheet has a plurality of cutouts stamped therein to define a lead configuration. Specifically, the lead configuration comprises a pair of power buses 12 and 14 which comprise elongated parallel conductive lines suitable for receiving electrical power. A first group of conductive leads 16 is disposed generally normally to the power bus 12, with leads 16 being arranged in a side-by-side relationship. Similarly, a second group of conductive leads 18 is disposed generally normally to the power bus 14, with the leads 18 arranged in a side-by-side relationship. While it will be understood that different numbers of conductive leads may be provided in dependence upon the integrated circuitry, in the illustrated embodiment, ten conductive leads comprise the first group 16 and ten conductive leads comprise the second group 18. Conductive leads 16 and 18 are utilized to provide input and output signals to the associated integrated circuit.

End portions of power bus 12 extend normally to the center portion of the power bus 12 and are identified as dummy or false leads 20. Similarly, end portions of power bus 14 extend generally normally to the central portion of power bus 14 and are generally identified as dummy or false leads 22. Each of the power buses 12 and 14 also include center extensions 24 and 26. As will be subsequently described in greater detail, these center bus extensions 24 and 26 operate as dummy or false conductive leads to assist in maintaining equal capacitance of neighboring conductive leads.

An important aspect of the present invention is that each of the conductive leads 16 and 18 are formed with a substantially identical geometric configuration. In this way, each of the conductive leads 16 and 18 have substantially identical capacitances.

Cutouts in the lead frame sheet also define a first group 28 of lead extensions and a second group 30 of lead extensions. As will be subsequently described, these lead extensions 28 and 30 are partially cut or trimmed away during final assembly of the integrated circuit package. Support bars 32 and 34 are provided on opposite ends of the wire frame in order to provide added support to the encapsulated package.

Locking extensions 32a and 34a are provided to enable locking of the support bars 32 and 34 within the plastic encapsulation to ensure integrity of the package.

In order to better understand the inventive concept wherein equal capacitances are provided to each of the conductive leads, conductive lead 36 will now be described in greater detail. Lead 36 is comprised of three different sections. The first section 36a is spaced apart from and oriented normally to the central power bus 12. The second or middle portion 36b of the lead is angled away from normal to the power bus 12 and has a trapezoidal cross-sectional area. The third section 36c of the lead is disposed normally to the central power bus 12. As will be subsequently described, section 36a of the lead is used to receive wire bonding to an active portion of the integrated circuit located below the lead. Section 36c of the lead extends from the integrated circuit package and is used to make physical contact with exterior circuitry. Locking notches 36f are provided in the conductive lead 36 to enable secure locking of the conductive lead within the encapsulation plastic in subsequent encapsulation steps to be described.

An important aspect of the present invention is that each of the conductive leads 16 and 18 have substantially identical cross-sectional areas as lead 36. As may be seen from the drawings, each of the first sections of the leads which correspond to section 36a are rectangular and have the identical cross-sectional area. Similarly, each of the trapezoidal areas corresponding to section 36b have substantially identical cross-sectional areas. An important aspect of the invention is that each of the mid sections of the conductive leads which form the trapezoidal areas have identical length upper and lower bases which form the trapezoidal area. Specifically, the base 36d of lead 36 is identical in length as the corresponding bases for all other conductive leads on the lead frame. Similarly, the base 36e forming the lower base of the trapezoidal area has an identical length as all other corresponding bases in the remaining conductive leads. It may also be seen that the heights of the trapezoidal areas of all the conductive leads 16 and 18 are the same. Since trapezoids with equal bases and equal heights have equal areas, the present invention provides an easy technique to ensure that all mid areas of the conductive leads are equal. Similarly, it may be seen that the areas of each of the third sections 36c of the conductive leads are identical. Since the geometrical areas of each of the conductive leads is identical, the capacitance of the leads will be found to be substantially identical.

An important aspect of the present invention is the provision of the trapezoidal mid-sections of the conductive leads which enable the leads to diverge from normal to accommodate sufficient size external lead pads to ensure adequate electrical contact with exterior circuits. Specifically, it may be seen that the top five conductive leads forming group 16 diverge from normal in an upward angle, while the bottom five conductive leads forming group 16 diverge from normal at a downwardly oriented angle. Similarly, the first five conductive leads forming group 16 diverge from normal at an upward angle, while the bottom five leads diverge from normal at a downward angle. The unique geometry of the conductive leads enables this divergence without a change in geometrical area and resulting capacitance.

Another important aspect of the invention is the provision of the dummy or false leads 20 and 22 as well as the center bus extensions 24 and 26 which form dummy or false leads. Without these dummy or false leads, certain of the conductive leads of the invention could have differing capacitances than their neighbors, because such leads were not surrounded on both sides with identically shaped leads. With the provisions of the identically shaped dummy or false lead extensions 20-26 from the power buses 12 and 14, neighboring conductive leads may be provided with identical capacitances. For example, without dummy or false lead 20, conductive lead 36 would have only its lower neighbor conductive lead closely associated therewith. However, with the provision of the upper dummy lead 20, which is provided with an identical shape to conductive lead 36, lead 36 is surrounded on both sides by identical leads.

Similarly, the center bus extensions 24 and 26 operate to provide equal capacitance to their neighbor leads. As may be seen, extensions 24 and 26 are of identical construction and each have a Y configuration. Referring specifically to extension 24, the Y configuration includes a leg 24a and 24b. It may be seen that each of the legs 24a and 24b are identical in construction and that they have substantially the same trapezoidal configuration as the mid portions of the two adjacent conductive leads. The legs 24a and 24b do not extend as far outwardly from power bus 12 as do the conductive leads, since the legs 24a and 24b will not extend outside of the hermetically sealed package. Locking notches 24c are provided in each of the legs in order to maintain the substantially identical geometric area, to ensure that the neighboring conductive leads see a substantially identical conductive mass to ensure that substantially identical capacitance is maintained in those adjacent conductive leads.

The Y shaped configuration of the extensions 24 and 26 enable equal capacitance to be provided to the conductive leads of the invention, even with the diverging orientation of the leads as previously described. In some cases, a small capacitance imbalance may be initially provided because the geometries of the legs 24a and 24b are not identical with those of the neighboring conductive leads. However, this imbalance may be nullified by carefully selecting the length of the legs 24a and 24b to provide the desired exact capacitance balance.

FIG. 2 illustrates a perspective exploded view of the connection of the lead frame 10 to an integrated circuit 40. Integrated circuit 40 may comprise any suitable type of integrated circuit for use with a lead frame 10, but it has been found particularly advantageous to use the present lead frame with integrated circuits such as DRAMs. In particular, because of the extreme complexity and small dimensions associated with circuits such as the 16 meg DRAM, the present invention is particularly adaptable for use with such complex circuits.

In accordance with the invention, two pieces of double-sided adhesive 42 and 44 are disposed over the top of the integrated circuit 40 and attach the lead frame 10 over the top of the integrated circuit 40. It is this configuration which leads to the description of the lead over chip (LOC). The use of the double-sided adhesive 42 and 44 is known, and the adhesive may comprise, for example, a double-sided thermosetting epoxy adhesive coated polyimide film which also acts as an active barrier. The integrated circuit 40 and the lead frame 10 form a self supporting structure. The power buses 12 and 14 and the conductive leads 16 and 18 provide for highly efficient central distribution of voltage, ground and control signals. The power buses 12 and 14 and conductive leads 16 and 18 are laminated directly over the primary heat generating circuits of the integrated circuit, thus optimizing heat dissipation.

When the lead frame 10 is affixed over the top face of integrated circuit 40 in the manner shown in FIG. 2, the resulting configuration will appear as shown in FIG. 3, which comprises a top view of the finished subassembly. The power buses 12 and 14 comprise spaced apart parallel conductive buses which run along the middle of the integrated circuit 40. The adhesives 42 and 44 are spaced apart such that active portions of the integrated circuit 40 are exposed for bonding to the conductive leads of the invention as will be subsequently described. Again, the identical configuration of the conductive leads 16 and 18 may be seen, which provides the substantially identical capacitance provided by the invention.

Referring to FIGS. 2 and 3, another important aspect of the invention may be understood. Because of the irregularity of metal disposed over the integrated circuit 40, certain circuits within the integrated circuit 40 are subject to noise. It has been determined that the provision of a conductive layer associated with the adhesives 42 and 44 serves to substantially shield the integrated circuit from the non-uniform leads of the lead frame. Referring also to FIG. 7, the double-sided adhesive, such as 42, may comprise a polyimide film 72 with thermosetting epoxy adhesive coatings 74 and 76 on both of its sides. In accordance with the invention, a layer of conductive metal 78 such as copper may then be placed on the sides of the adhesives 42 and 44 away from the integrated circuit 40. Adhesive 80 may then be deposited over the metallic layer for connection to the underside of the lead frame 10. Substantial noise shielding is thus provided by the conductive layer associated with the bonding adhesives 42 and 44.

After the lead frame 10 has been connected to the integrated circuit 40 by adhesives 42 and 44, the subassembly is laminated under suitable temperature and pressure conditions and is then oven cured to fully cross-link the adhesive.

Figure 4:
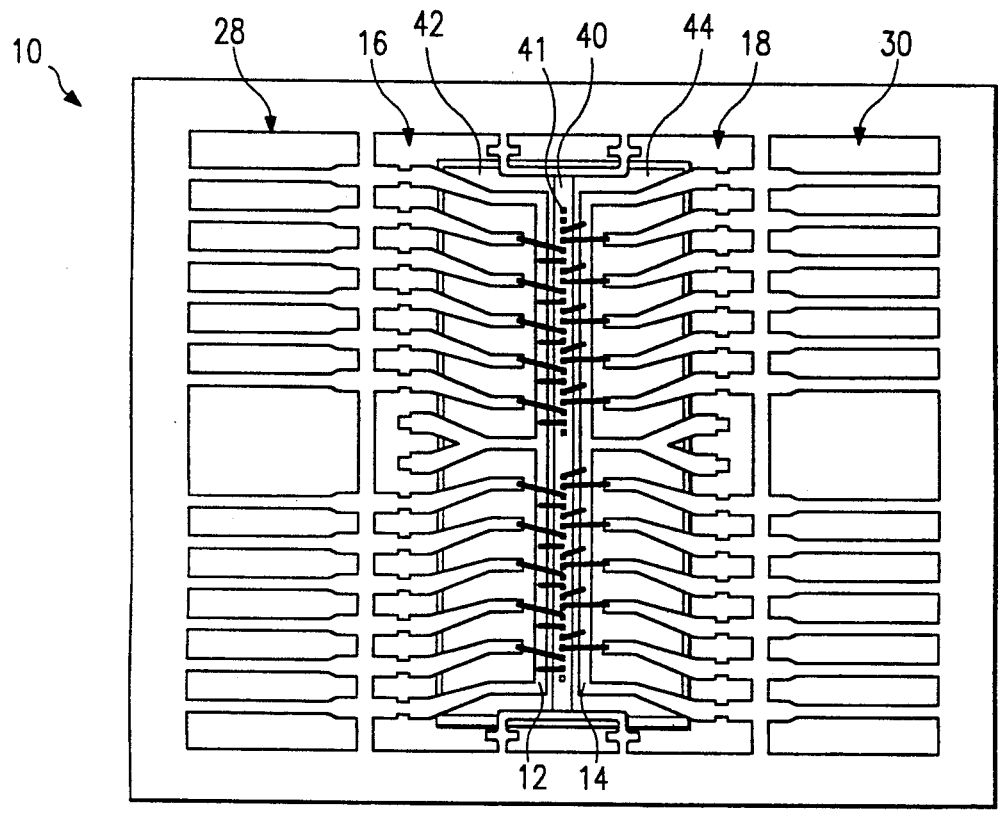
FIG. 4 is a top view of the lead frame of the invention showing wire bonds from portions of the integrated circuit to ones of the conductive leads of the lead frame.
Figure 6:
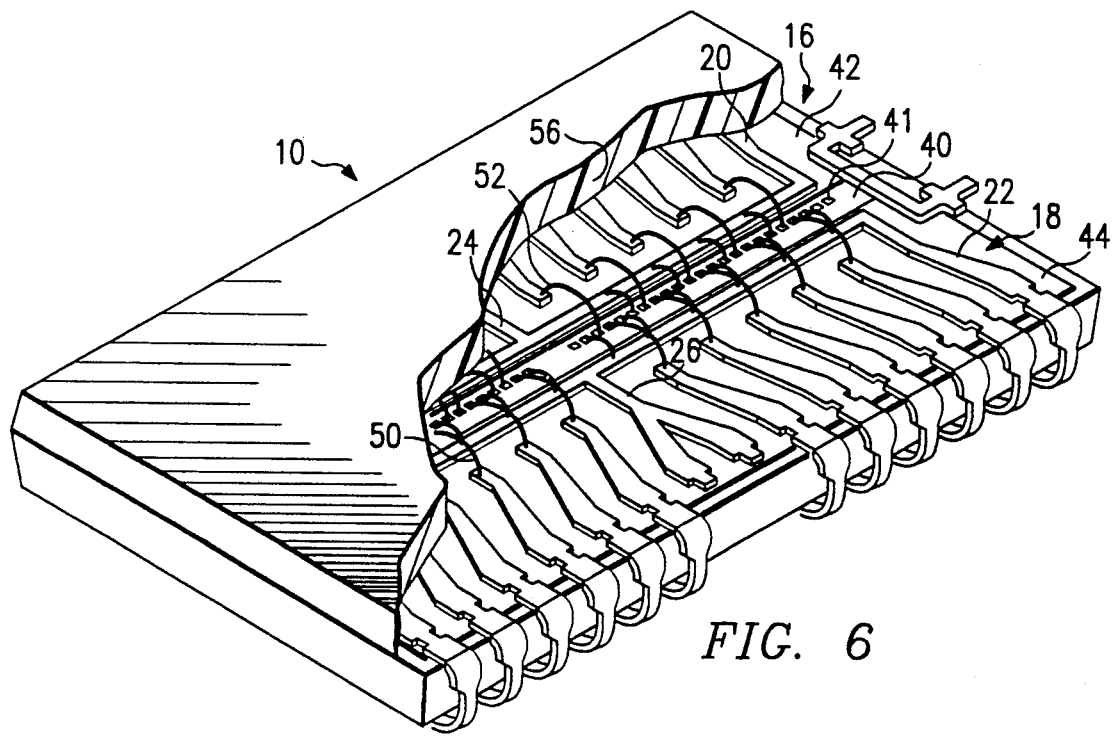
FIG. 6 is a perspective view, partially broken away, of a completed integrated circuit package utilizing the present invention.

FIG. 4 illustrates the next stage of assembly of the present invention wherein high speed thermosonic gold ball wire bonding is accomplished. While it will be understood that various types of wire bonding may be utilized with the invention, bonding using 0.001 in diameter gold wire has been successfully accomplished. As noted, the gold wire bonds selected portions such as bond pads 41 of the integrated circuit 40 to selected portions of the power buses 12 and 14 and to the conductive leads 16 and 18. For example, as depicted in FIG. 6 wire lead 50 connects the integrated circuit to power bus 12, while wire lead 52 bonds a bond pad of the integrated circuit to one of the conductive leads 16. It will be understood that the wire bonding scheme will vary depending upon the particular configuration of the integrated circuit 40 used with the invention.

After testing of the wire bond ball connections by suitable shear and pull tests, transfer molding of the invention with a molding compound is conducted. While different molding compounds are usable with the present invention, a Novolac epoxy mold compound has been found to work well to encapsulate the entire integrated circuit device. Because of the complexity of the circuitry, low stress mold techniques are utilized. The molded device is then cured, deflashed and lead preparation is conducted on the external leads. The leads are then trimmed and formed by bending to produce the nearly finished product depicted in FIGS. 5 and 6.

FIG. 5 illustrates an end view of the substantially finished product wherein the integrated circuit 40 may be seen encapsulated within a plastic body 56. Conductive leads 16 and 18 are shown extending from over the integrated circuit 40 and adhesives 42 and 44 to external of the molded plastic body 56. Leads 16 and 18 are bent for suitable physical and electrical contact with external circuitry. Wire bonds 50 and 52 may be seen connecting portions of the integrated circuit 40 with the leads 16 and 18.

FIG. 6 illustrates in perspective a partially cut away view of the finished semiconductor package. The plastic encapsulation totally surrounds the integrated circuit 40 and all portions of the adhesives 42 and 44. FIG. 6 illustrates clearly the side-by side symmetrical relationships of the lead conductors 16 and 18. It may be seen that the geometry and shape of each of the twenty conductive leads 16 and 18 are substantially identical to one another and that the trapezoidal middle section of the conductive leads enables the leads to diverge from one another while yet maintaining identical geometry. It may also be seen how the dummy or false leads 20-22 act to balance the capacitance of the end conductive leads. FIG. 6 further illustrates the center bus extensions 24 and 26 and shows how the geometry of the Y shaped legs of the extensions 24 and 26 operate as dummy or false leads to balance the capacitance of the diverging neighboring conductive leads.

Again, the provision of the metallic coating on the adhesive tapes 42 and 44 tends to isolate the elements on the integrated circuit 42 from electrical disturbances in the lead frame 10. The resultant symmetry of the present lead frame design and the addition of the dummy or false leads from the power buses improves the thermal dissipation and lowers thermal or temperature gradients of the packaging system, thus allowing a greater number of and more evenly distributed thermal paths.

An important aspect of the invention is that by balancing the capacitance in the manner described above, the equality of loading capacitance between signal leads is maintained at all lead frame heights above the surface of the integrated circuit 42. In other words, it is possible to provide the conductive leads 16 and 18 with upsteps or downsteps at any arbitrary line parallel to the edge of the integrated circuit package. In this manner, the conductive leads may be stepped up or down as needed in order to control the total loading capacitance of the package, while maintaining the equality of capacitance between the individual conductive leads. Moreover, the up or down setting of the leads enables accurate control of the thermal dissipation properties of the package and the stress distribution of the package. The provision of such up or down steps in the conductive leads while maintaining equal capacitance is not available with other designs due to the differing geometries of the neighboring leads.

When the device is fabricated to the stage indicated by FIG. 6, additional lead finishing with eutectic lead solder dipping, singulation, marking, inspection test and burn-in are required to complete the final product for use.

While it will be understood that the actual dimensions of the lead frame 10 of the present invention will vary in dependence upon its intended use, it has been found that a typical width of section 36a (FIG. 1) may be 0.015 in. while the width of the third section 36c of the conductive lead may comprise 0.025 in. The total length of a conductive lead 16 or 18 in the preferred embodiment may be 0.3 in. The above-noted dimensions have been found to adequately accommodate an integrated package having the dimensions 340×660 mm.

Although the present invention has been described in detail, it should be understood that various changes, substitutions and alterations can be made herein without departing from the spirit and scope of the invention as defined by the appended claims.

What is claimed is:

1. A lead frame for integrated circuitry comprising:
   a plurality of juxtaposed elongated conductive leads having first ends for connecting to an integrated circuit and second ends for providing electric connections to external circuits;
   the geometrical area of each of said leads being substantially identical such that the capacitance of each of said leads is substantially identical; and
   an elongated power bus having a central portion generally perpendicular to said conductive leads and having end portions of substantially identical geometric areas as said conductive leads to maintain equal capacitance for all of said conductive leads.

2. The lead frame of claim 1 wherein each of said conductive leads has a trapezoidal configuration, the geometrical area of said trapezoidal configuration of each said lead being substantially identical.

3. The lead frame of claim 2 wherein said trapezoidal configuration of each said lead is disposed between said first and second ends of each said lead.

4. A lead frame for integrated circuitry comprising:
   a plurality of juxtaposed elongated conductive leads having first ends for connecting to an integrated circuit and second ends for providing electric connections to external circuits;
   the geometrical area of each of said leads being substantially identical such that the capacitance of each of said leads is substantially identical; and
   an elongated power bus having a central portion generally perpendicular to said conductive leads and spaced from said first ends of said leads; and
   an extension from said power bus lying between two groups of said leads having substantial identical geometrical areas as said leads to maintain equal capacitance for said leads.

5. An integrated circuit device comprising:
   an integrated circuit encapsulated in an insulating package;
   conductive leads extending through the insulating package to the integrated circuit;
   each of said conductive leads having substantially the geometrical area and identical capacitance as the remaining conductive leads; and
   at least one power bus extending adjacent said integrated circuit and said conductive leads;
   said power bus including extensions oriented adjacent said conductive leads to act as false leads to maintain equal capacitance of each of said conductive leads.

6. The integrated circuit device of claim 5 and further comprising:

an insulating layer disposed between said integrated circuit and said conductive leads; and a conductive layer disposed on said insulating layer to provide noise shielding to said integrated circuit.

7. An integrated circuit device comprising:
a lead frame overlying an active side of an integrated circuit, connected by wirebonds to the active side of the integrated circuit;
said lead frame including a plurality of conductive leads;
said conductive leads having an angled portion which defines a trapezoid, the geometric areas of the trapezoids of the conductive leads being approximately equal to provide substantially identical capacitances to said integrated circuit.

8. The integrated circuit device of claim 7 wherein said integrated circuit comprises a dynamic random access memory.

9. The integrated circuit device of claim 7 and further comprising at least one power bus extending generally along the length of said integrated circuit, said power bus including false lead extensions having angled portions that define a trapezoid which lie adjacent ones of said conductive leads, the geometric areas of the trapezoids of the angled portions being about the same size as the areas of the trapezoids of the conductive leads to ensure that said conductive leads have substantially identical capacitances.

10. The integrated circuit device of claim 9 wherein said false lead extensions comprise the end portions of said power bus.

11. The integrated circuit device of claim 9 wherein said false lead extensions comprise a centrally located extension from said power bus.

12. The integrated circuit device of claim 11 wherein said centrally located extension has a Y configuration, with each leg of said configuration having a substantially identical area as that of a conductive lead.

13. An integrated circuit device comprising:
an integrated circuit having a top face carrying plural bond pads arranged linearly and centrally along the length of the top face;
a lead frame including a plurality of conductive leads for transmitting power and signals to and from said integrated circuit, said conductive leads extending over the top face of the integrated circuit to be closely spaced from the plural bond pads;
an insulating layer disposed between said integrated circuit and said lead frame, said insulating layer having a central open space for making connections between the plural bond pads and the conductive leads;
a conductive layer disposed between said integrated circuit and said lead frame and adjacent said insulating layer, said conductive layer also having a central open space substantially the same as the central open space of the insulating layer for making connections between the plural bond pads and the conductive leads; and
bond wires extending through the central open spaces of the insulating layer and the conductive layer and extending between said plural bond pads and said conductive leads electrically to connect the integrated circuit to the lead frame.

14. The device of claim 13 including adhesive layers mounting said insulating and conductive layers between said lead frame and said integrated circuit.

15. The device of claim 13 in which said conductive layer is formed on said insulating layer.

16. A lead frame, comprising:
a first plurality of lead fingers;
a second plurality of lead fingers;
a first power supply bus lying between the first plurality of lead fingers and the second plurality of lead fingers, generally perpendicular to the first plurality of lead fingers, connected to two of the first plurality of lead fingers;
a second power supply bus lying between the first plurality of lead fingers and the second plurality of lead fingers, generally perpendicular to the second plurality of lead fingers, connected to two of the second plurality of lead fingers;
a first dummy lead lying between the lead fingers of the first plurality of lead fingers, connected to the first power supply bus; and
a second dummy lead lying between the lead fingers of the second plurality of lead fingers, connected to the second power supply bus.

17. The lead frame of claim 16 wherein each of the first dummy lead and the second dummy lead comprise:
a first member having two ends, connected by one end to the power supply bus;
a second member connected to the other end of first member, flared from the first member; and
a third member connected to the other end of the first member, flared from the first member and the second member to give a "Y" shaped configuration to the first member, the second member, and the third member.

18. The lead frame of claim 17 wherein the first plurality of lead fingers, the second plurality of lead fingers, the first dummy lead, and the second dummy lead are configured to have balanced capacitance.

19. A semiconductor packaged device, comprising:
a semiconductor chip having a major surface with bonding pads thereon disposed within an encapsulating material;
a balanced capacitance lead frame, having:
a first plurality of adjacent lead fingers and a second plurality of adjacent lead fingers, the first plurality of adjacent lead fingers and the second plurality of adjacent lead fingers having outer ends extending through the encapsulating material and having inner tips overlying the major surface of the semiconductor chip for connecting to the bonding pads of the semiconductor chip;
a first power supply bus and a second power supply bus, the first power supply bus and the second power supply bus lying adjacent to each other over the major surface of the semiconductor chip between the inner tips of the first plurality of adjacent lead fingers and the inner tips of the second plurality of adjacent lead fingers;
first and second power supply bus lead fingers, adjacent to the first plurality of adjacent lead fingers, having outer ends extending through the encapsulating material and inner tips connected to the first power supply bus;
third and fourth power supply bus lead fingers, adjacent to the second plurality of adjacent lead fingers, having outer ends extending through the encapsulating material and inner tips connected to the second power supply bus; and wherein the first plurality of adjacent lead fingers, the second plurality of adjacent lead fingers, the first and second power supply bus lead fingers, and the third and fourth power supply lead fingers are shaped and are arranged to provide balanced capacitance.

20. The semiconductor packaged device of claim 19 wherein the balanced capacitance lead frame further has:
- a first dummy lead disposed within the encapsulating material between the first plurality of adjacent lead fingers, having a tip portion connected to the first power supply bus and first and second legs flared from the tip portion;
- a second dummy lead disposed within the encapsulating material between the second plurality of adjacent lead fingers, having a tip portion connected to the first power supply bus and first and second legs flared from the tip portion; and
wherein the first dummy lead and the second dummy lead are shaped and arranged to provide balanced capacitance.

21. The device of claim 13 in which said insulating and conductive layers are both formed in two separate parts that are arranged on opposite sides of the plural bond pads.

22. The device of claim 13 in which said conductive layer is free of any electrical connections.

23. The device of claim 13 including a first adhesive layer adhering to said top face of said integrated circuit and a first side of said insulating layer, a second adhesive layer adhering to a second side of the insulating layer and to a first side of the conducting layer, and a third adhesive layer adhering to a second side of the conductive layer and to the lead frame conductive leads.

24. The device of claim 13 in which said lead frame includes a pair of power buses running parallel to one another and said plural bond pads and plural groups of conductive leads disposed generally normally to the power buses and arranged in side-by-side relationship on sides of the power buses opposite the plural bond pads.

25. The device of claim 24 in which the bond wires connect from the power buses and the conductive leads to the plural bond pads.

* * * * *